(12) United States Patent
Frankowsky et al.

(10) Patent No.: US 6,324,125 B1
(45) Date of Patent: Nov. 27, 2001

(54) PULSE WIDTH DETECTION

(75) Inventors: Gerd Frankowsky, Wappingers Falls; Hartmud Terletzki, Pleasant Valley, both of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/281,020

(22) Filed: Mar. 30, 1999

(51) Int. Cl.[7] .............................. G04F 10/00; G04F 8/00
(52) U.S. Cl. ............................................. 368/113; 368/120
(58) Field of Search ........................... 368/113–120; 327/31, 33, 36, 37, 269–271; 331/45, 57, 90

(56) References Cited

U.S. PATENT DOCUMENTS

| | | | |
|---|---|---|---|
| 4,439,046 | * 3/1984 | Hoppe | 368/10 |
| 4,875,201 | * 10/1989 | Dalzell | 368/120 |
| 5,179,438 | * 1/1993 | Morimoto | 358/17 |
| 5,199,008 | * 3/1993 | Lockhart et al. | 368/117 |
| 5,694,377 | * 12/1997 | Kushnick | 368/120 |
| 5,796,682 | * 8/1998 | Swapp | 368/120 |
| 5,818,797 | * 10/1998 | Watanabe et al. | 368/113 |

\* cited by examiner

*Primary Examiner*—Vit Miska
(74) *Attorney, Agent, or Firm*—Stanton C. Braden

(57) ABSTRACT

A semiconductor circuit is provided including circuitry for producing a pulse. A plurality, n, of delay elements are provided each enabled and disabled in parallel by the pulse. Each delay element is adapted to transmit the pulse from an input to an output, with the pulse reaching the respective outputs at different times. A plurality, n−1, of detectors is provided each having an input coupled to an input of a corresponding delay element. Each detector is adapted to set a state of its output to a predetermined state, from a plurality of states, in response to receiving a portion of the pulse. The outputs of the detectors are coupled to output pins of the semiconductor circuit. A tester is provided that is adapted to couple to the semiconductor output pins and detect the state of the detector outputs.

23 Claims, 10 Drawing Sheets

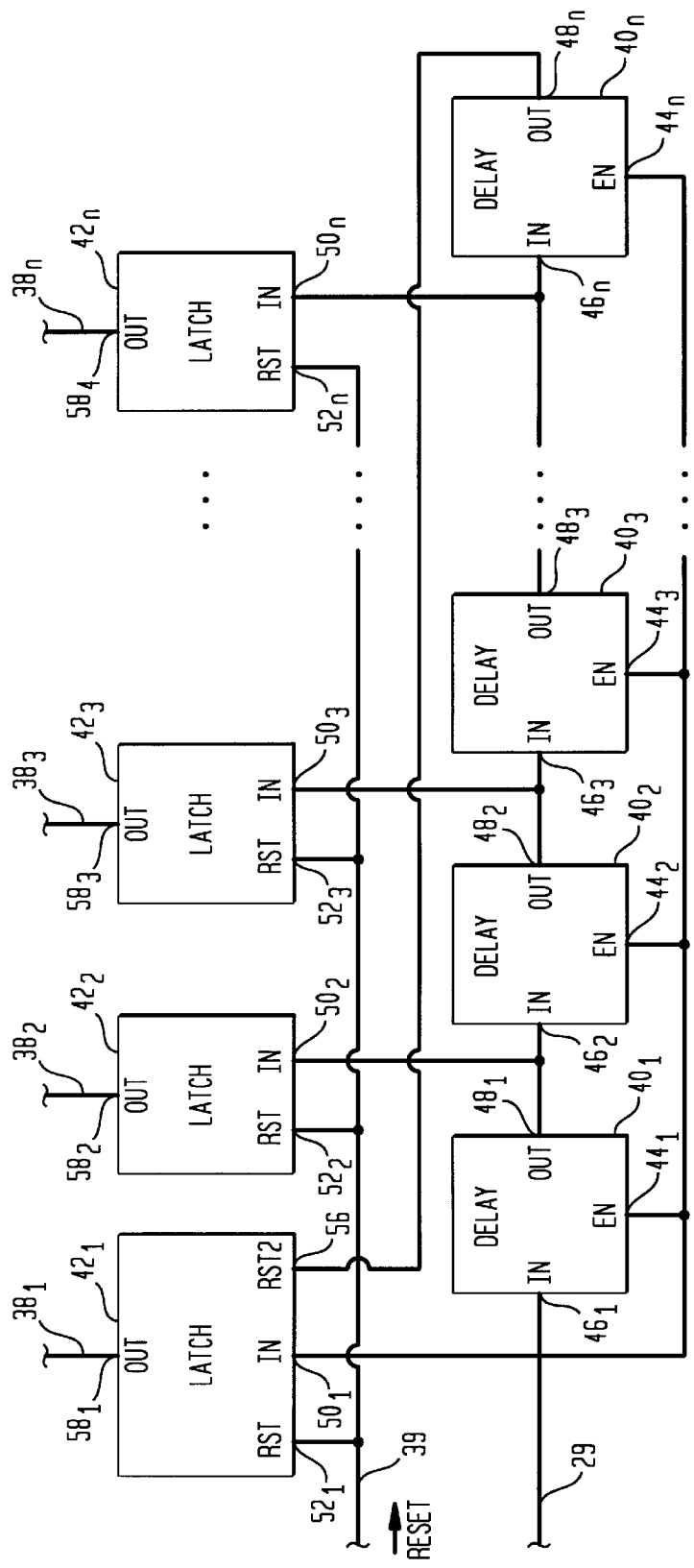
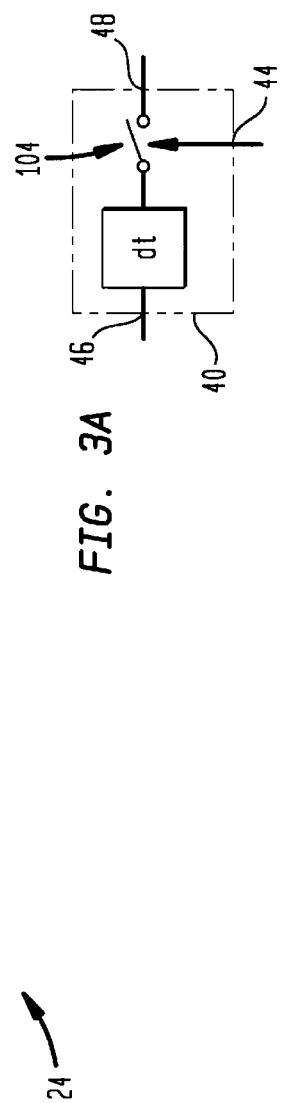
FIG. 3
FIG. 3A

PULSE WIDTH DETECTION

BACKGROUND OF THE INVENTION

The invention relates to pulse width detectors and more particularly to apparatus and methods for measuring pulse widths in semiconductor circuits during the manufacture thereof.

As is known in the art, in the manufacture of semiconductor circuits, a significant cost is incurred in testing such circuits. Testing is necessary to detect manufacturing or design defects effecting operational characteristics of the circuits. For example, many semiconductor circuits, such as Dynamic Random Access Memories (DRAMs), use internally-generated pulses to convey information. Different pulse widths (i.e., time durations) convey different information. Because the pulses can control various functions of the circuit, it is desirable to test the circuit to ensure that all of the pulses produced by the circuit have proper pulse widths.

Much of the cost for testing these circuits is the result of the cost of the test equipment. With pulse widths typically on the order of 2–4 ns, the test equipment needs to have a very fine time resolution in order to determine whether the pulse has an acceptable pulse width. If the pulse width is measured by probing a conductor carrying the pulse and the test equipment used to sample the pulse on the conductor, then the test equipment needs to sample the pulse at a frequency on the order of 1 GHz (i.e., a sampling period of $1/10^9$ seconds or 1 nanosecond (ns)) in order to provide a time duration resolution on the order of 1 ns. Test equipment having operational or sampling frequencies this high is typically very expensive.

SUMMARY OF THE INVENTION

In accordance with one feature of the invention, a semiconductor circuit is provided including operational circuitry configured to produce a signal to be tested. Test circuitry is provided to sense the signal. The test circuitry provides indications of whether a pulse in the sensed signal has a time duration at least as long as corresponding, different, time durations. The indications effectively divide the pulse into a plurality of time cells or windows indicative of different ranges of time durations, with differences between a maximum time duration and a minimum time duration of each window being a timespan of that window. The indications indicate which of the windows includes the time duration of the pulse. The indications provided by the test circuitry are at a frequency, $f_1$, that is lower than a frequency, $f_2$, that is defined by an inverse of a shortest one of the timespans. The test circuitry is operated independently of a clock signal having a clock frequency $f_{CLK}$ that is greater than the frequency $f_2$.

With such an arrangement, a signal, which may include high-frequency components, in the semiconductor circuit can be tested at a relatively high effective sampling frequency, $f_s$, and a characteristic (e.g., a level or a pulse width) of the signal can be expressed in a format having a lower frequency, $f_c$, thereby enabling an effectively high-frequency sampling without requiring expensive high-frequency test circuitry.

In accordance with another feature of the invention, a semiconductor circuit is provided including operational circuitry configured to produce a signal, having at least one pulse, to be tested. Test circuitry is provided to sense the signal at a high effective sampling frequency and to produce an indication of a characteristic of the pulse or pulses. The indication of the characteristic is at a frequency that is lower than the effective sampling frequency. The test circuitry does not need, and is therefore independent of a clock signal having a clock frequency that is greater than the effective sampling frequency.

With such an arrangement, high-frequency performance of circuit components and high-frequency quality of signals in the circuit can be measured with lower-frequency test equipment.

In accordance with another feature of the invention, a semiconductor circuit is provided including circuitry for producing a pulse. A plurality of, n, delay elements is provided each enabled and disabled in parallel by the pulse. Each delay element is adapted to transmit the pulse from an input to an output thereof, with the pulse being received at respective outputs thereof at correspondingly different times. A plurality, n–1, of detectors is provided each having an input coupled to an input of a corresponding one of the delay elements. Each detector is adapted to set an output state to a predetermined one of a plurality of states in response to detection of a portion of the pulse.

With such an arrangement, a pulse width can be determined to be within a range of time durations having a timespan $1/f_s$, and expressed in a format that is detectable at a frequency $f_c$ that is lower than the frequency $f_s$.

In accordance with another feature of the invention, the outputs of the detectors are coupled to output pins of the semiconductor circuit.

With such a structure, pulse widths can be detected by a relatively inexpensive tester after the semiconductor circuit has been packaged.

In accordance with another feature of the invention, a semiconductor circuit is provided including operational circuitry, delay elements, and a decoder. The operational circuitry produces a pulse having a pulse width. The pulse enables and disables the delay elements in parallel, which provide the pulse to a plurality of output ports at different times. The decoder receives the pulse from the delay element output ports and provides a signal to indicate a time duration window that includes the pulse width.

With such a structure, relatively low-frequency signals can be used to indicate that a window, or which window, of time durations includes the pulse width. For example, such signals can include an analog DC voltage on a single line, and/or serial digital binary DC voltage levels on a single line, and/or digital binary DC voltage levels on multiple lines, e.g., in parallel.

In accordance with another feature of the invention, a semiconductor circuit is provided comprising circuitry for producing a pulse, n serially coupled delay elements, and n latches. The delay elements are enabled and disabled in parallel by leading and trailing edges, respectively, of the pulse, and serially transmit the pulse from delay element inputs to delay element outputs thereof with associated time delays. Each latch is adapted to set its output to a first predetermined state if the latch receives a portion of the pulse at its input, which is coupled to a corresponding delay element input. At least one of the latches is adapted to set its output to a second predetermined state if the latch receives a portion of the pulse from the output of a last one of the n delay elements.

With such an arrangement, indications are provided as to whether any pulse is produced and, if a pulse is produced, which of n bounded windows of time durations a width of the pulse is within, or that the width is longer than a maximum delay of the delay elements.

In accordance with another feature of the invention, a semiconductor circuit is provided comprising circuitry for providing a pulse, n delay elements, and n−1 latches. The delay elements are adapted to be activated and deactivated by a first edge and a second edge, respectively, of the pulse received in parallel at corresponding enable ports thereof. Each delay element is adapted to transmit the pulse, with a corresponding time delay, from a delay element input port to a delay element output port thereof. Each latch has; a latch input port, coupled to a corresponding delay element input port, and a latch output port, and is adapted to provide a DC signal to the latch output port if the first edge of the pulse is received at the latch input port.

In accordance with another feature of the invention, a semiconductor circuit is provided including operational circuitry, a delay element, and a latching element. The operational circuitry provides a pulse. The delay element is selectively coupled to the operational circuitry, is enabled and disabled by the pulse, and transmits the pulse from a delay element input port to a delay element output port thereof in a delay time. The latching element is selectively coupled to an output contact of the semiconductor circuit and is adapted to provide a DC signal to the contact in response to receiving a portion of the pulse from the delay element output port.

In accordance with another feature of the invention, an apparatus is provided including a first device activated and deactivated by leading and trailing edges, respectively, of a pulse received by the first device. The first device is configured to receive the pulse and to provide it to a plurality of output ports at a plurality of different output times. The different output times define a plurality of windows of time durations having corresponding timespans, with the inverse of the shortest timespan representing a first frequency. A second device is provided coupled to the plurality of output ports of the first device and is adapted to provide one or more indications of whether a portion of the pulse reached each of the output ports. Each indication is detectable at a second frequency, that is lower than the first frequency.

With such an arrangement, a width of the pulse can be determined to be within a small window of time durations having a timespan corresponding to a first frequency, and expressed in a format that is detectable at a second frequency, lower than the first frequency.

In accordance with another feature of the invention, an apparatus is provided comprising n serially coupled delay elements. The delay elements are activated and deactivated in parallel by leading and trailing edges, respectively, of a pulse. Each delay element is adapted to receive the pulse at a delay element input port thereof and to output the signal to a delay element output port thereof delayed by a time delay. Each of n detectors has a detector input port coupled to a corresponding delay element input port and is adapted to set a detector output port thereof to a first DC level if it receives the leading edge of the pulse at the detector input port. A first one of the detectors is adapted to set its output port to a second DC level if it receives the leading edge of the pulse at a reset port coupled to the output port of a last one of the n delay elements.

In accordance with another feature of the invention, a system for testing a semiconductor circuit is provided. A semiconductor circuit is provided including a circuit for producing a signal pulse having a pulse time duration. A test circuit is provided adapted to provide a digitized indication of the pulse time duration. The digitized indication corresponds to one of a plurality of windows of time durations having corresponding timespans. A tester is provided that is adapted to detect the digitized indication using an operating frequency that is lower than an inverse of a shortest one of the timespans.

With such an arrangement, the tester can determine the pulse width to be within a small window of time durations, the timespan of that window corresponding to a first frequency, while having an operating frequency lower than the first frequency.

In accordance with another feature of the invention, the test circuit provides the digitized indication to output pins of the semiconductor circuit.

With such a structure, pulse widths can be detected by a relatively inexpensive, relatively low-frequency tester after the semiconductor circuit has been packaged.

In accordance with another feature of the invention, a system for testing a semiconductor circuit is provided. A semiconductor circuit is provided including circuitry for producing a pulse. Each of n delay elements are enabled and disabled in parallel by the pulse. The delay elements transmit the pulse to output ports so that the pulse reaches the output ports at different output times defining time duration windows having corresponding timespans. Each of n−1 detectors has a detector input coupled to an input of one of the delay elements and is adapted to set a detector output to a predetermined state if it receives a portion of the pulse. A tester is provided that has an operational frequency that is lower than the shortest timespan and that is adapted to detect the predetermined state.

With such an arrangement, the pulse width can be determined to be within a small range of time durations and can be detected by the tester at a frequency lower than a sampling frequency needed to yield the same resolution.

BRIEF DESCRIPTION OF THE DRAWINGS

Other features and advantages of the invention, as well as the invention itself, will become more readily apparent when taken together with the following detailed description and the accompanying drawings, in which:

FIG. 3 is a diagrammatical view of an example of the test circuitry shown in FIG. 2, including delay elements and latches;

FIG. 3A is a schematic diagram of a delay element shown in FIG. 3;

FIG. 8A is a schematic diagram of a delay element shown in FIG. 8;

DESCRIPTION OF THE PREFERRED EMBODIMENTS

Figure 1:
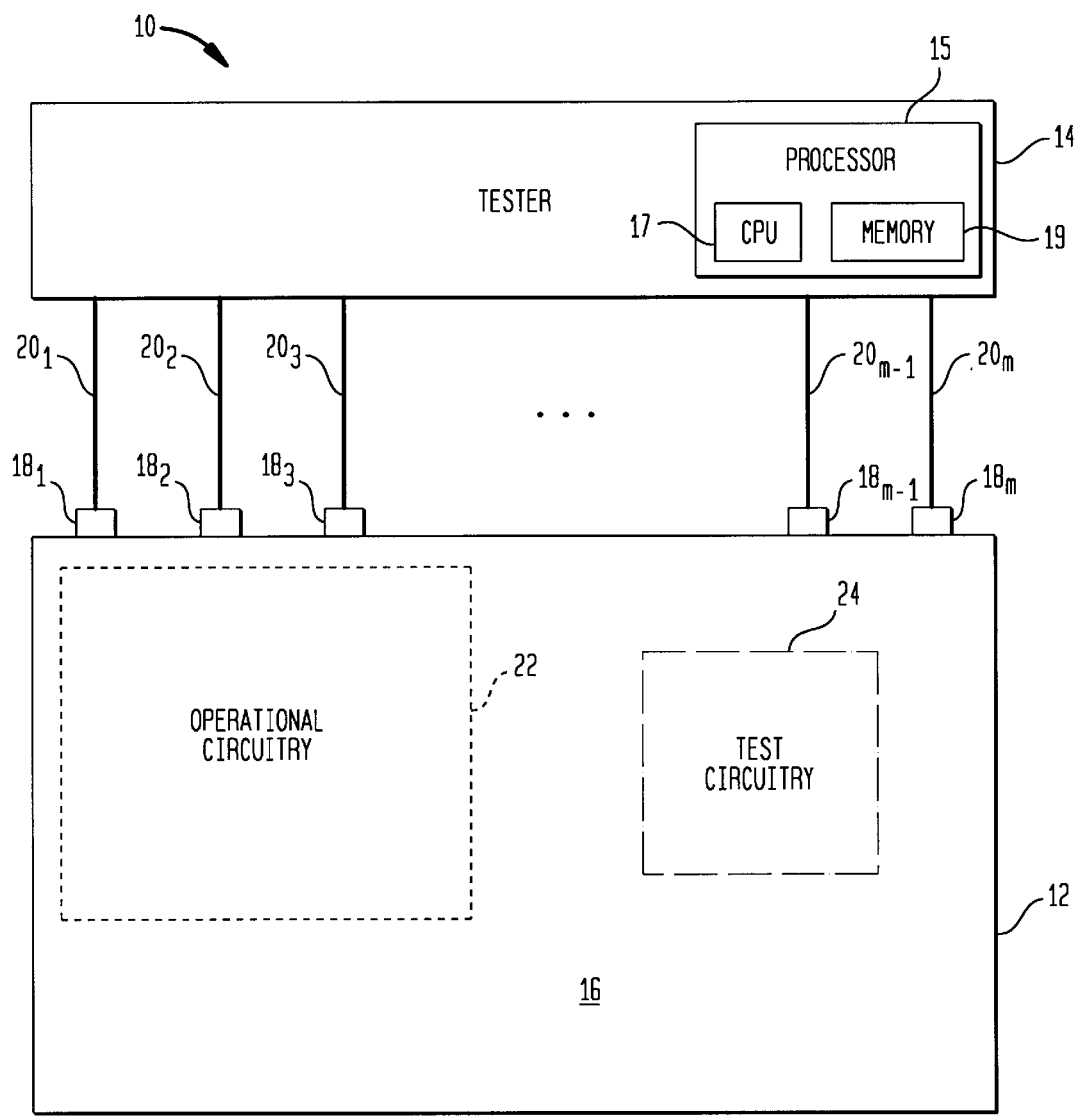
FIG. 1 is a block diagram of a semiconductor circuit under test by a tester according to the invention.

Referring now to FIG. 1, a semiconductor integrated circuit test system 10 is shown to include a semiconductor integrated circuit 12 under test by a tester 14.

As described more fully below, the system 10 provides high-resolution testing using a relatively low-frequency, inexpensive tester 14. Suffice it to say here that the circuit 12 produces signals, detects the signals, and produces indications of the signals with a resolution typical of high sampling frequency apparatus, without needing a high frequency clock signal, such that the low-frequency tester 14 can sense and process the indications from the circuit 12.

The semiconductor circuit 12 is formed on a single crystal body or substrate 16 (i.e., a die or chip) such as silicon and can be any of a variety of well known types of circuits, e.g., a memory or a processor. Possible types of memories include, but are not limited to, Static Random Access Memories (SRAMs) and DRAMs. The circuit 12 has a plurality of pins $18_1$–$18_m$ that are connected through lines $20_1$–$20_m$ to the tester 14 to provide communication with the tester 14.

The tester 14 transmits signals to, and receives and processes signals from, the circuit 12. For testing a memory, the tester 14 transmits test signals including, but not limited to, row address and column address signals, a Row Address Strobe (RAS) signal, a Column Address Strobe (CAS) signal, and a Test Mode TM signal. The tester 14 supplies these signals to the circuit 12 and monitors/detects signals from the circuit 12 through the lines $20_1$–$20_m$ and pins $18_1$–$18_m$. The received signals are analyzed by a processor 15, including a central processing unit CPU 17 and a memory 19, in the tester 14 to provide indications of the results of the test.

The circuit 12 includes operational circuitry OC 22 and test circuitry 24. The operational circuitry 22 produces very short pulse widths. During test modes, the test circuitry 24 monitors the pulse widths.

In order to monitor widths of pulses in the operational circuitry 22 with adequate resolution, the test circuitry 24 has a high effective sampling frequency. "Effective sampling frequency" means that a frequency needed to periodically monitor (i.e., the inverse of the time between monitoring) a signal in order to determine the signal's quality with desired resolution is simulated, without requiring sampling or clocking (and therefore a clock signal) at that frequency. In other words, the test circuitry 24 can monitor the operational circuitry 22, and produce outputs, in such a way as to simulate sampling the operational circuitry at a high frequency without actually sampling at that high frequency. For example, here the test circuitry 24 can determine the pulse width to be within 0.2 nanosecond (ns) windows, so the effective sampling frequency is 1/0.2 ns=5 GHz. Also, if the test circuitry 24 can determine the quality (e.g., level) of the signal every 0.2 ns, then the effective sampling frequency is also 5 GHz.

The system 10 therefore does not need a high frequency clock signal. Thus, the test circuitry 24 can be operated independently of such a clock signal (i.e., the test circuitry does not need such a clock signal even if the system 10 includes such a clock signal). By not using such a clock signal, noise associated with such signals is avoided.

The circuit 12 can be, e.g., as shown, a DRAM adapted to produce pulses on the order of 2–4 ns, while the tester 14 operates, and therefore monitors, senses or detects signals from the circuit 12 through lines $20_1$–$20_m$, at an operational frequency of about 25–100 Mhz. This operational frequency is much lower than the effective sampling frequency of the test circuitry 24. In other words, the time between monitoring by the tester 14 is longer than the smallest resolution of the test circuitry 24. The test circuitry 24 provides digitized indications of the pulse widths to the pins 18 for detection by the tester 14.

Figure 2:
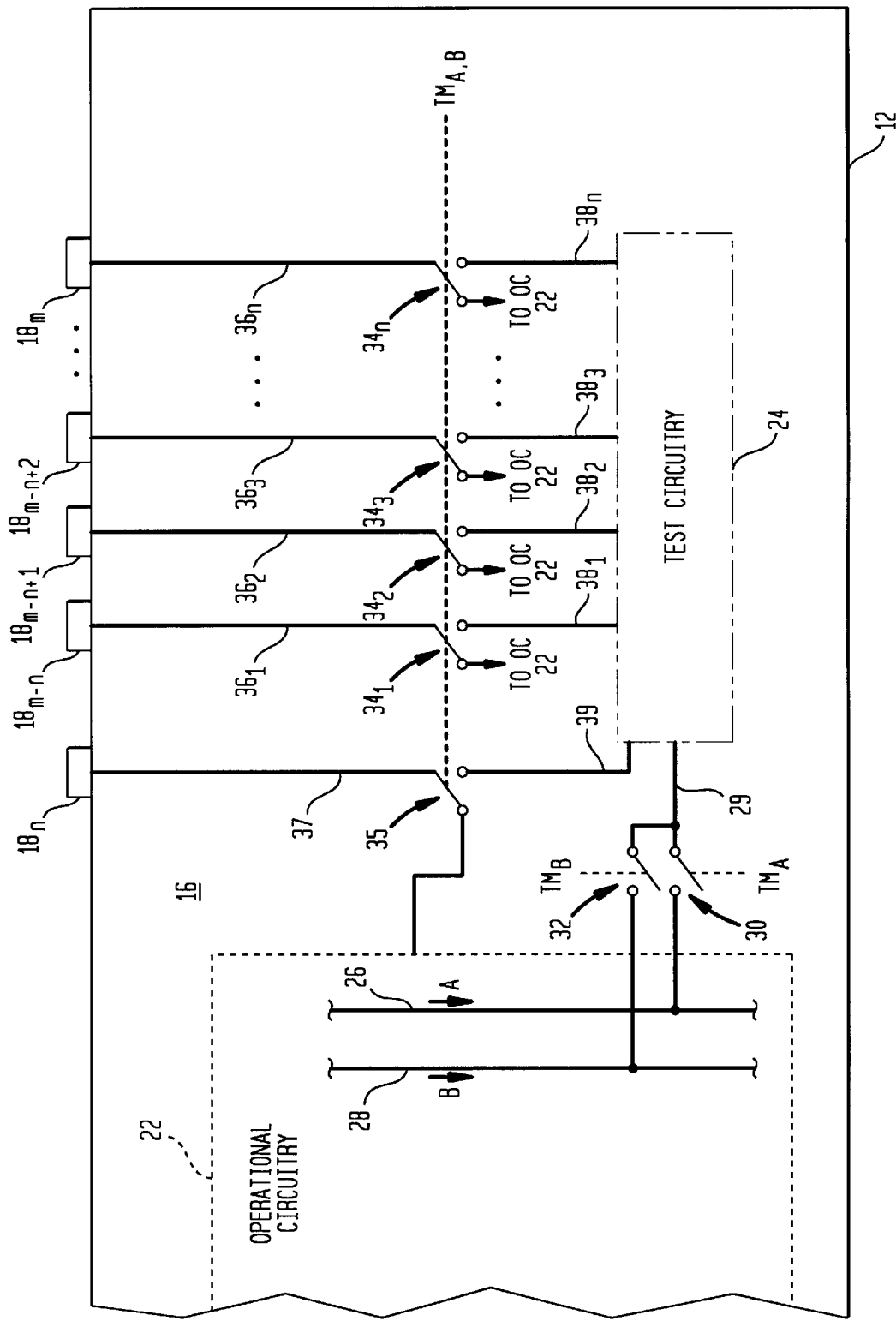
FIG. 2 is a diagrammatical view of portions, including test circuitry shown in block form, of the semiconductor circuit shown in FIG. 1.

Referring now to FIG. 2, the operational circuitry 22 is shown to be selectively connected to the test circuitry 24 as controlled by two test mode signals $TM_A$ and $TM_B$. The test mode signals $TM_A$ and $TM_B$ are indicative of two possible modes, test mode A and test mode B, of testing the operational circuitry 22. The operational circuitry 22 is shown to include two lines 26 and 28 that carry signal A and signal B, respectively, that each include pulses to be tested. Line 26 is connected to the test circuitry 24 through a line 29 when a switch 30 is closed in response to the test mode signal $TM_A$. Line 28 is connected to the test circuitry 24 through line 29 when a switch 32 is closed in response to the test mode signal $TM_B$. The test mode signals $TM_A$ and $TM_B$ can be generated in the circuit 12 (e.g., in the test circuitry 24), or can be received from the tester 14 through the pins 18.

The test mode signals $TM_A$ and $TM_B$ also control selective coupling of the pins 18 to the test circuitry 24. Either test mode signal $TM_A$ or $TM_B$ causes switches $34_1$–$34_n$, and 35 to connect pins $18_{m-n}$–$18_m$ and $18_r$ to the test circuitry 24 by joining lines $36_1$–$36_n$ and 37 to lines $38_1$–$38_n$ and 39. In the absence of the test mode signals $TM_A$ and $TM_B$, the lines $36_1$–$36_n$ and 37 are connected through the switches $34_1$–$34_n$ and 35 to the operational circuitry OC 22.

Referring now to FIG. 3, the test circuitry 24 is shown to include a plurality of n delay elements $40_1$–$40_n$ and a plurality of n detectors or latches $42_1$–$42_n$. The delay elements $40_1$–$40_n$ have enable ports $44_1$–$44_n$ coupled in parallel to the line 29 and are adapted to be enabled and disabled by pulses on the line 29. The delay elements $40_1$–$40_n$ also have input ports $46_1$–$46_n$ and output ports $48_1$–$48_n$ coupled inn series, forming a delay chain (i.e., the output port $48_1$ of the first delay element $40_1$ is connected to the input port $46_2$ of the second delay element $40_2$, etc., with the input port $46_1$ connected to the line 29). The delay elements 40 pass signals received via the line 29 through each of the delay elements 40. The latches $42_1$–$42_n$ have input ports $50_1$–$50_n$ connected to corresponding ones of the input ports $46_1$–$46_n$ of the delay elements $40_1$–$40_n$, and reset ports $52_1$–$52_n$ connected to the line 39 for receiving a reset signal RESET from the tester 14 through the pin $18_r$, the line 37, and the switch 35. The first latch $42_1$ has a second reset port RST2 56 connected to the output port $48_n$ of the last delay element $40_n$, providing feedback of any signal present at tile output port $48_n$.

The delay elements $40_1$–$40_n$ are each configured to pass a signal received at the respective one of the input ports $46_1$–$46_n$ to the respective one of the output ports $48_1$–$48_n$ delayed by corresponding time delays $dt_1$–$dt_n$. Referring also to FIG. 3A, a delay element 40 functions as a switch 104, that closes in response to a signal (e.g, rising edge of a signal) from the enable port 44, thereby allowing a signal to pass from the input port 46 to the output port 48, delayed by a delay time dt. The time delays $dt_1$–$dt_n$ may be different for some or all of the delay elements 40, or may be substantially the same. The delay realized by a signal passing through the series of delay elements 40, however, is different at each of the delay element output ports 48, the delay being the sum of all the time delays dt of all the delay elements 40 in the series between the line 29 and the output port 48 in question. Thus, each time delay of the delay elements 40 corresponds to a window of time durations. The inverse of the shortest time delay is the effective sampling frequency because the shortest delay represents the finest resolution possible for determining the pulse width. The delay elements 40 transmit signals with little attenuation.

Figure 4A:
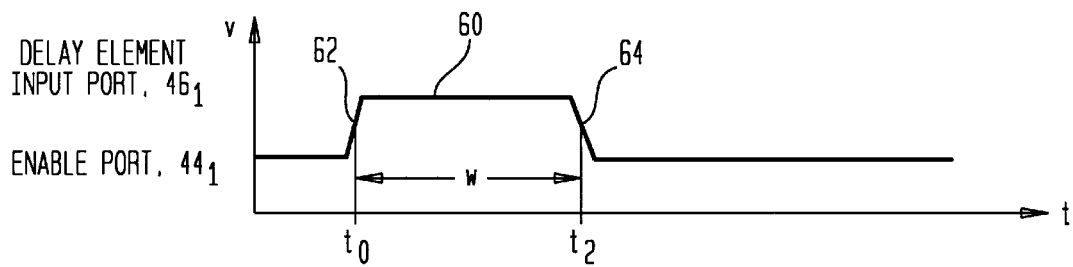
FIGS. 4A–4C are timing diagrams of signals in the test circuitry shown in FIG. 3.
Figure 4B:
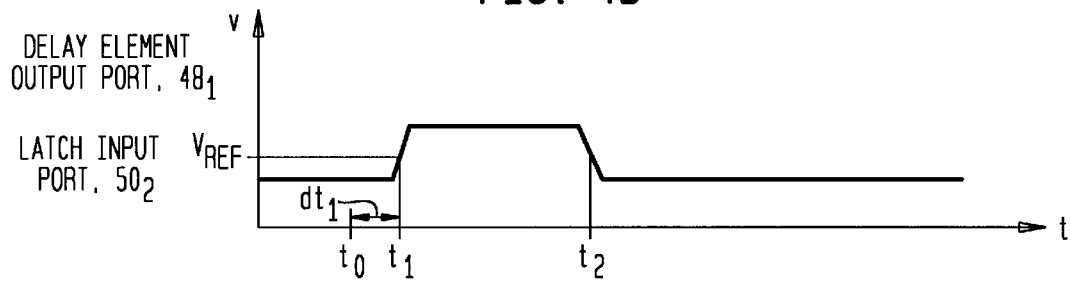

FIGS. 4A–4B illustrate the timing of signals enabling, and being transmitted by, the delay element $40_1$. FIG. 4A shows that a pulse 60 on line 29 is received by the delay element $40_1$ at the enable port $44_1$ and at the input port $46_1$ at substantially the same time, $t_0$. A leading edge 62 of the pulse 60 enables the delay element $40_1$ to transmit the pulse 60 from the input port $46_1$ to the output port $48_1$. FIG. 4A shows that the pulse 60 begins (i.e., is received at the input port $46_1$ and the enable port $44_1$) at time $t_0$ and ends at time $t_2$, having a pulse width $w=t_2-t_0$. The pulse 60 is provided at the output port $48_1$ at a time $t_1$ after the time delay $dt_1$ of the delay element $40_1$ (i.e., $dt_1=t_1-t_o$). The pulse 60 is provided at the output port 48, until the pulse 60 present at the enable port $44_1$ ends, with a trailing edge 64 of the pulse 60 disabling the delay element $40_1$.

Figure 5:
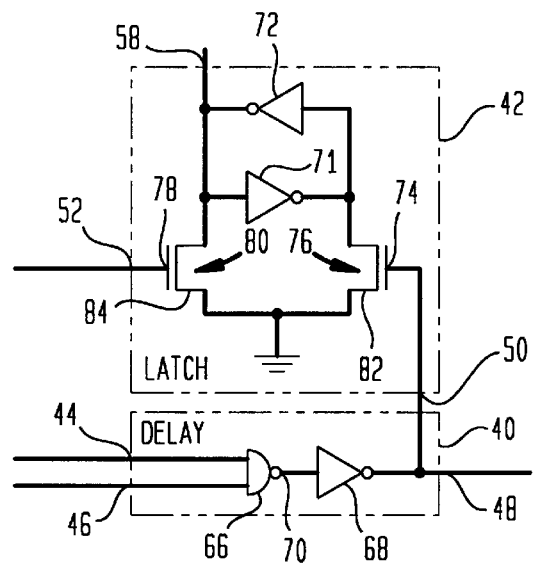
FIG. 5 is a schematic diagram of an exemplary delay element and an exemplary latch.
Figure 10:
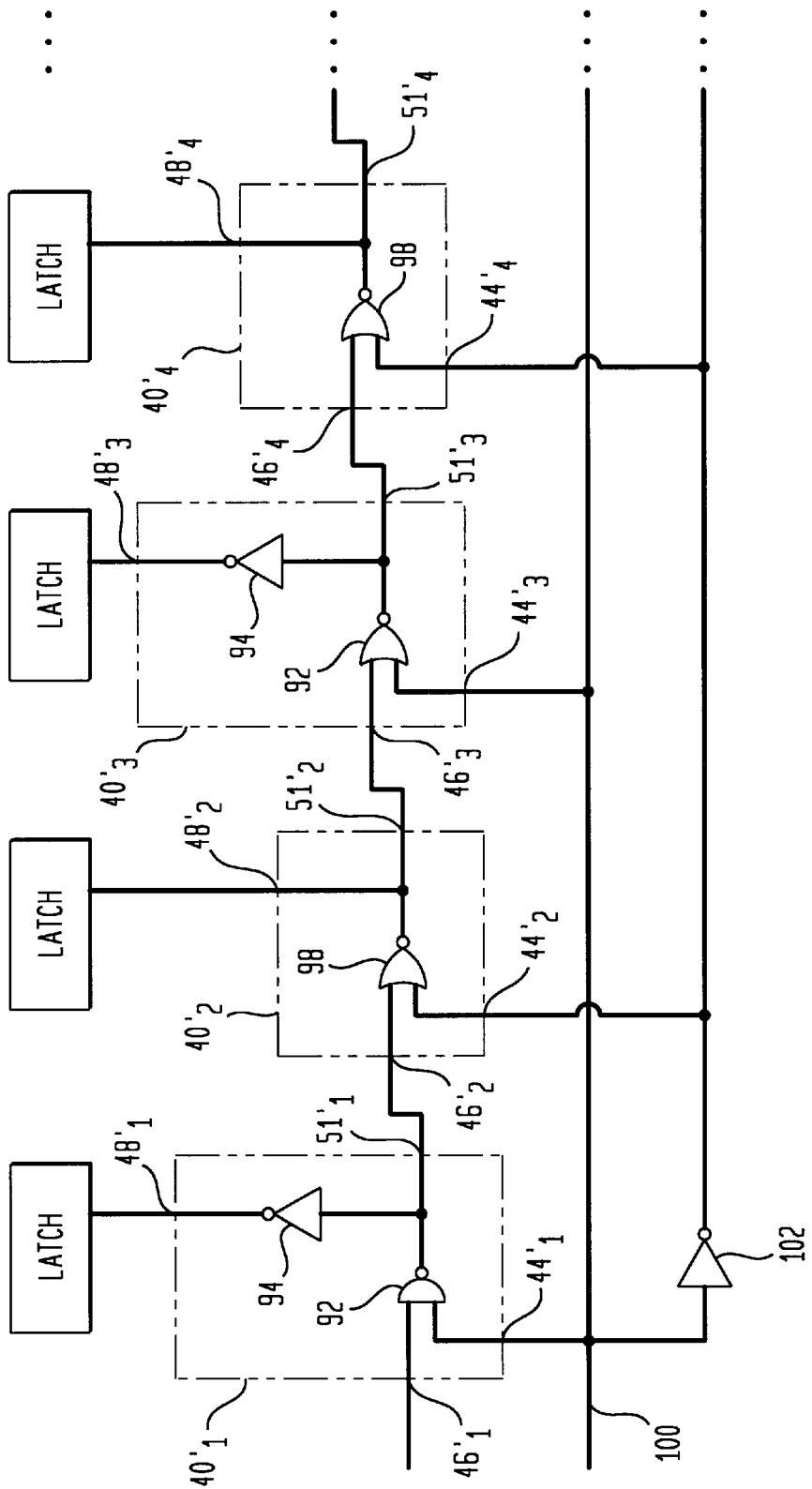
FIG. 10 is a schematic diagram of another delay configuration.

FIG. 5 illustrates an exemplary embodiment of one of the delay elements 40. As shown, the delay element 40 includes a NAND gate 66 coupled in series to an inverter 68. Inputs to the NAND gate 66 correspond to the enable port 44 and the input port 46 of the delay element 40, and an output 70 of the NAND gate 66 feeds the inverter 68. An output of the inverter 68 corresponds to the output port 48 of the delay element 40. With this configuration, the time delays introduced by the NAND gate 66 and the inverter 68 are both about 80–100 picoseconds (ps), yielding a time delay dt of about 160–200 ps. Other delay elements are possible, e.g., as shown in FIG. 10.

Referring again to FIGS. 3 and 4A, the latches $42_1$–$42_n$ are configured to set and hold their output ports $58_1$–$58_n$ to a static energy level, e.g., a high DC voltage, in response to receiving the leading edge 62 of the pulse 60 at their input ports $50_1$–$50_n$. The signal level or potential is transmitted to the pins $18_{m-n}$–$18_m$ through lines $36_1$–$36_n$ and switches $34_1$–$34_n$ because lines $38_1$–$38_n$ are coupled to the output ports $58_1$–$58_n$ of the latches $42_1$–$42_n$. The term latches as used herein refers generally to a circuit that sets and holds an output state in response to detecting a particular signal at its input, even if the signal at its input changes thereafter. The latches 42 will reset their respective output ports $58_1$–$58_n$ in response to receiving a leading edge of a pulse at their respective reset ports 52 and/or 56.

Figure 4C:
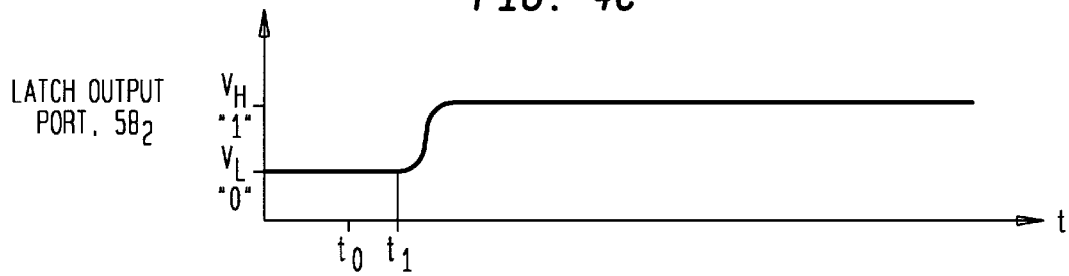

FIGS. 4A–4C illustrate the timing of the pulse 60 at the latch input $50_2$ and output $58_2$ in relation to the pulse 60 at the delay element input $46_1$ and output $48_1$. Before the pulse 60 reaches the delay output port $48_1$, the latch output port is at a low voltage level $V_L$, corresponding to a binary "0". As shown in FIG. 4B, the pulse 60 is provided to the delay output $48_1$ and the latch input $50_2$ at substantially the same time, $t_1$. When the voltage at the latch input $50_2$ is high enough to actuate the latch $42_2$, exceeding reference level $V_{REF}$, the latch $42_2$ sets the latch output $58_2$ (FIG. 4C) to a high voltage level $V_H$ substantially equal to the magnitude of the pulse 60, corresponding to a binary "1". Thus, the latch $42_2$ provides a static energy level indication at its output port $58_2$ that the pulse 60 is at least as long as the time delay $dt_1$ of the delay element $40_1$. If the pulse was not at least this long, then the delay element $40_1$ would be disabled before the latch $42_1$ could set its output $58_2$ to the binary 1 level.

FIG. 5 illustrates an exemplary embodiment of one of the latches 42. As shown, the latch 42 includes two cross-coupled inverters 71 and 72. The latch input 50 is connected to a gate 74 of a Field Effect Transistor (FET) 76 while the latch reset port 52 is connected to a gate 78 of a FET 80. The FETs 76 and 80 have their sources 82 and 84 connected to ground. The FET 80 has its drain connected to the output port 58 of the latch 42. A pulse received at the gate 78 will reset the voltage at the output port 58 to zero.

Operation of the system 10 will be described with reference to the preceding figures, and to FIGS. 6A–6L which show the timing of the outputs of the latches $42_1$–$42_{10}$ as a pulse 86 travels through the n, here 10, delay elements $40_1$–$40_{10}$. Because there are 10 delay elements 40, each here with a time delay dt of about 200 ps, the test circuitry 24 can determine pulse widths up to a maximum pulse width of 1.8 ns with a resolution of 200 ps. The test circuitry 24 indicates through the outputs of the latches $42_1$–$42_{10}$ in which window of time durations the pulse width falls. The windows are defined by the minimum time duration and the maximum time duration indicated. The duration or length of each window (i.e., the difference between the maximum and minimum time durations indicated ) corrresponds to a respective delay element 40 and is a resolution of the measurement (200 ps in this case).

Table 1 illustrates the states of the latch output ports $58_1$–$58_{10}$ for various windows of time durations for pulses received by the delay elements $40_1$–$40_{10}$.

TABLE 1

| LATCH OUTPUTS | RESULT/WINDOW |
| --- | --- |
| 0000000000 | No Pulse |
| 1000000000 | Pulse Width ≦ dt |
| 1100000000 | dt ≦ Pulse Width ≦ 2dt |
| 1110000000 | 2dt ≦ Pulse Width ≦ 3dt |
| 1111000000 | 3dt ≦ Pulse Width ≦ 4dt |
| 1111100000 | 4dt ≦ Pulse Width ≦ 5dt |
| 1111110000 | 5dt ≦ Pulse Width ≦ 6dt |
| 1111111000 | 6dt ≦ Pulse Width ≦ 7dt |
| 1111111100 | 7dt ≦ Pulse Width ≦ 8dt |
| 1111111110 | 8dt ≦ Pulse Width ≦ 9dt |
| 1111111111 | 9dt ≦ Pulse Width ≦ 10dt |
| 0111111111 | Pulse Too Long |

As shown, the binary values indicated by the static energy levels at the latch output ports $58_1$–$58_{10}$ provide digitized indications that: there was no pulse, there was a pulse having a pulse width within a certain window (e.g., between 0 ns and 0.2 ns, between 0.2 ns and 0.4 ns, etc.), or there was a pulse having a pulse width longer than the total delay, here 2.0 ns, of the delay elements $40_1$–$40_{10}$, i.e., a "pulse too long" indication. The "pulse too long" indication is provided by resetting the first latch $42_1$ to a binary 0.

Referring to FIGS. 1–3 and 6 in particular, in operation, the tester 14 is connected to the circuit 12 and communicates with the circuit 12 to send the reset signal RESET to the latches 42, setting the output ports $58_1$–$58_{10}$ to zero volts, at time $t_{rst}$, regardless of their previous values (FIGS. 6A and 6C–6L), and to initiate a test mode. For example, referring to FIG. 2, initiating test mode A closes switch 30, coupling line 26 to line 29, and closes switches $34_1$–$34_n$, coupling the latches $42_1$–$42_n$ to the pins $18_{m-n}$–$18_m$. Selectively coupling lines in the operational circuitry 22 to the test circuitry 24 allows a single test circuit 24 to test many pulses on many different lines. The pulse 86, here with a width of 1.7 ns (FIG. 6B), is produced in the operational circuitry 22 as part of signal A and conveyed to the test circuitry 24 through lines 26 and 29 and switch 30.

Figure 6A:
FIGS. 6A–6L are timing diagrams of signals in the test circuitry shown in FIG. 3.
Figure 6B:
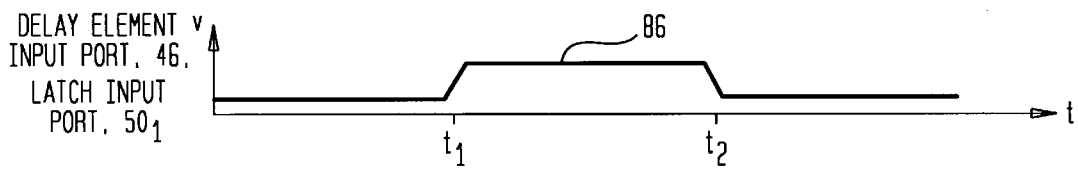
Figure 6C:
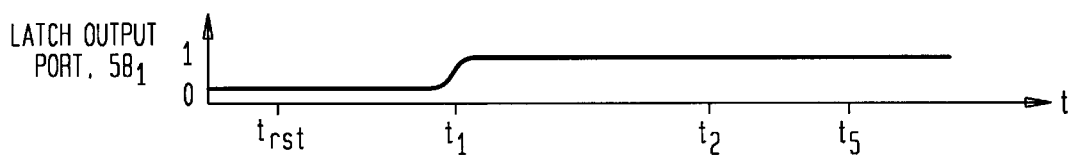
Figure 6D:
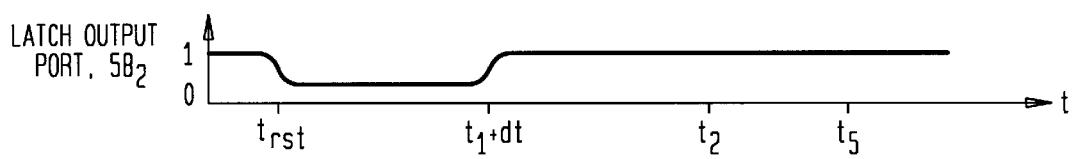
Figure 6E:
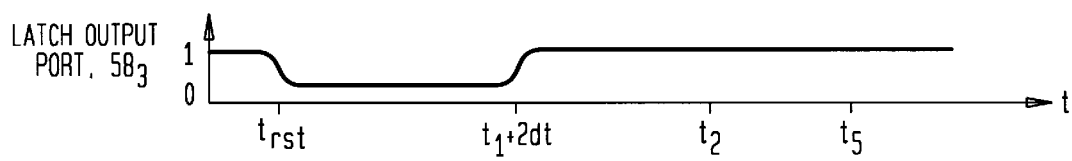
Figure 6F:
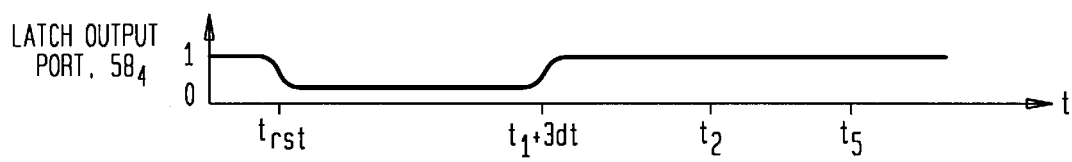
Figure 6G:
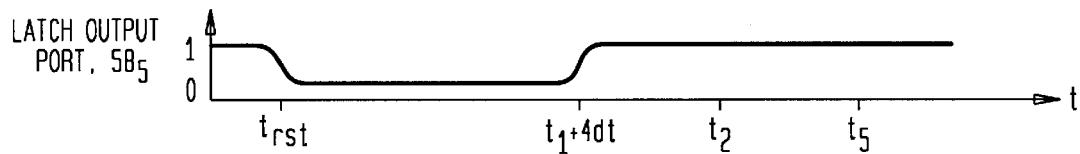
Figure 6H:
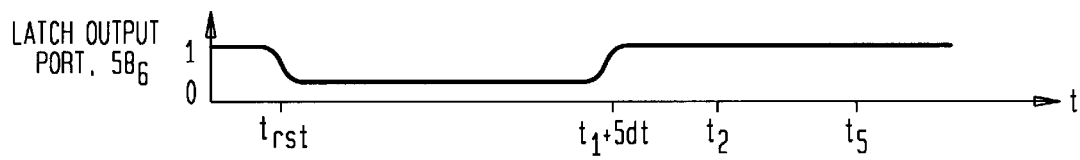
Figure 6I:
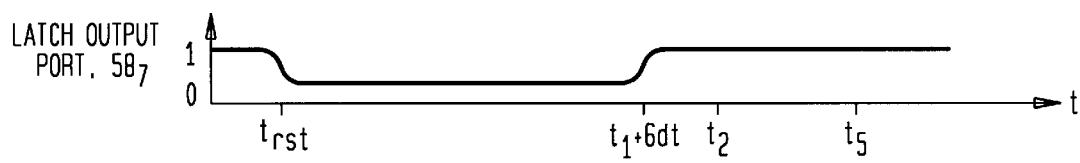
Figure 6J:
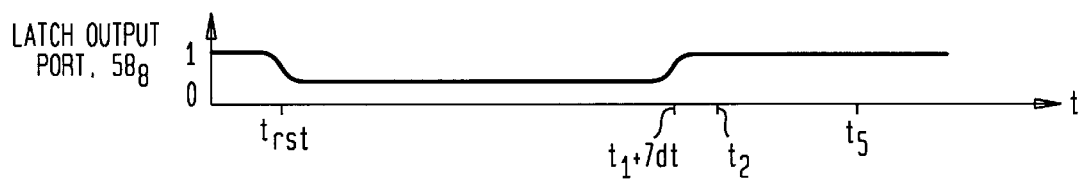
Figure 6K:
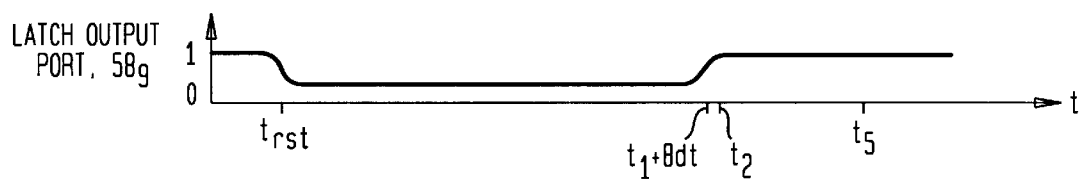
Figure 6L:
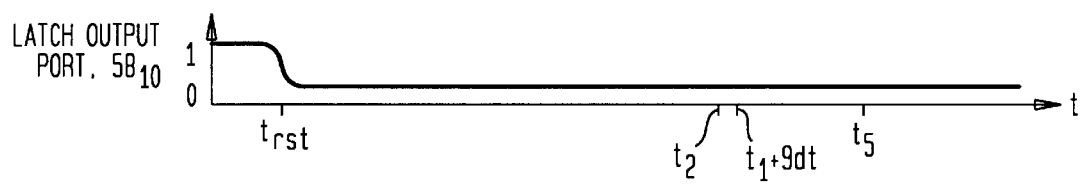

The pulse 86 travels through the delay elements 40, causing the latches 42 to set voltages of their outputs 58 to indicate which window of time durations includes the width of the pulse 86. The pulse 86 on line 29 is received by the test circuitry 24 at time $t_1$, causing latch $42_1$ to set its output port $58_1$ to a 1, as shown in FIG. 6C, at time $t_1$ (assuming no delay in the latch $42_1$). The pulse 86 enables all of the delay elements $40_1$–$40_{10}$ substantially simultaneously at time $t_1$. The pulse 86 travels through delay elements $40_1$–$40_9$, reaching the delay element output ports $48_1$–$48_8$ at different times ($t_1+dt$, $t_1+2dt$, etc.) and setting the latch output ports $58_2$–$58_9$ to binary 1's (FIGS. 6D–6L) at these times (assuming no delay in the latches $42_2$–$42_9$). The pulse 86 does not reach the output port $48_9$ before the pulse 86 ends at time $t_2$, disabling the delay elements $40_1$–$40_{10}$. Thus, the latch output ports $58_1$–$58_{10}$ have binary values of 111111110, indicating that the pulse width is between 8dt and 9dt (i.e., between 1.6 ns and 1.8 ns).

The voltages at the latch output ports $58_1$–$58_{10}$ are transmitted through respective lines 38, switches 34, and lines 36 to pins 18. The tester 14 can sample the pins 18 connected to the latches 42 at a time $t_s$ after the total delay time, n*dt, here 10dt, and before the latches 42 are reset by the reset signal RESET. Outputting the latches to the pins 18 allows the testing to be done after packaging because the circuit 12 does not need to be probed internally. Using static energy levels allows the tester 14 to detect the indications from the latches 42 while having an operational frequency that is slower than the inverse of the smallest test circuitry resolution. In other words, the tester 14 can operate at a low frequency relative to the effective sampling frequency of the test circuitry 24, here 1/200 ps=5 GHz.

The processor 15 in the tester 14 analyzes the outputs from the latches 38 and provides one or more indications of the test results. The CPU 17 uses the latch outputs when accessing Table 1, which is stored as a look-up table in the memory 19, to find the corresponding result/window of time durations containing the pulse width. The CPU 17 then produces one or more indications, such as a numeric display, of the pulse width. The CPU 17 can also determine whether the indicated window is acceptable (i.e., whether the pulse width is in a desired window) and provide a pass/fail indication of the determination.

Figure 7:
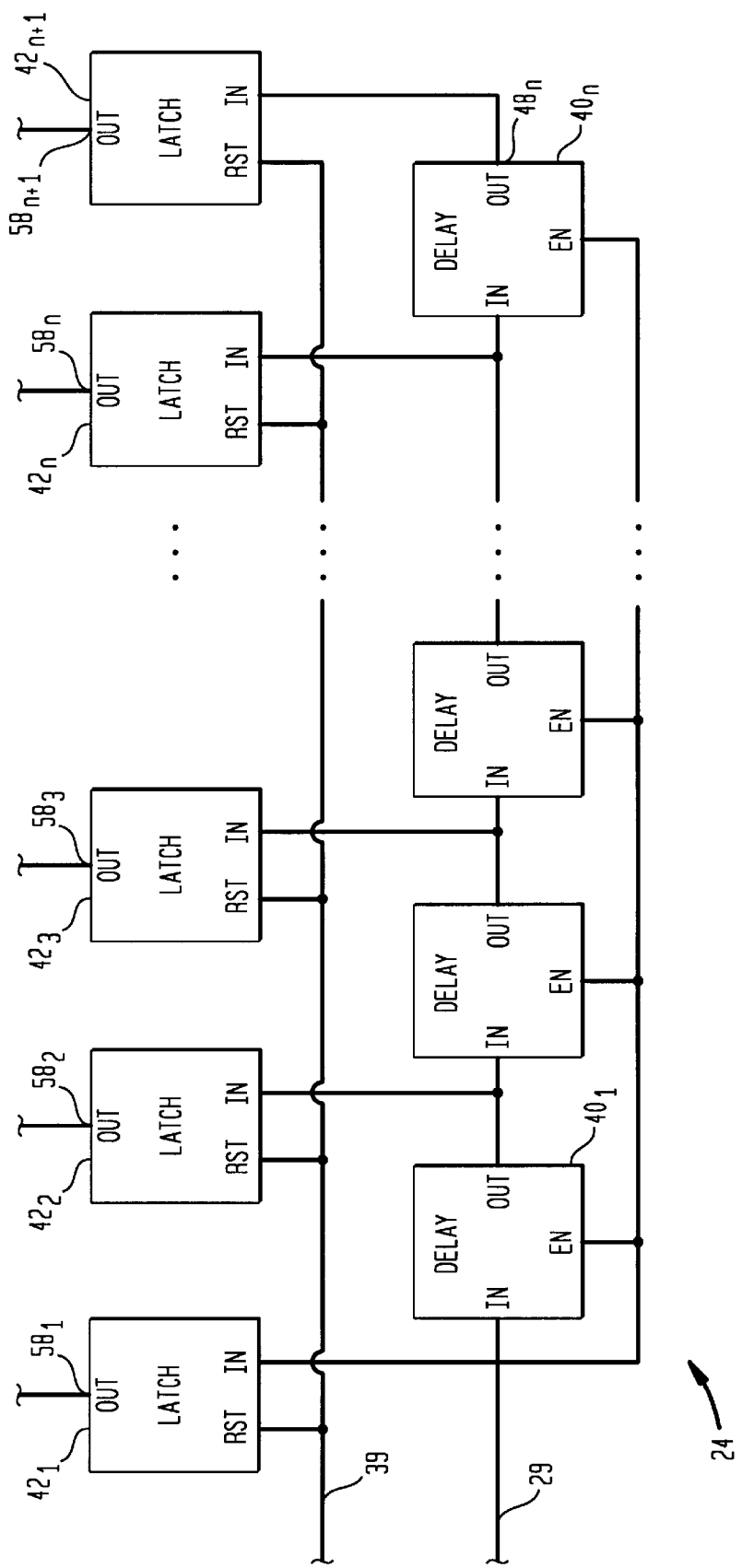
FIGS. 7–8 are diagrammatical views of more examples of the test circuitry shown in FIG. 2.

FIG. 7 illustrates another configuration of the test circuitry 24. In this embodiment, there is no feedback from the last delay element output port $48_n$ to any latch 42. In order to provide the "pulse too long" indication, another latch $48_{n+1}$ is connected to the output port $48_n$. Thus, the "pulse too long" indication would be all 1's as indicated by the outputs 58 of the n+1 latches 42. The configuration shown in FIG. 7 can thus provide the same information as provided by the configuration shown in FIG. 3.

Figure 8:
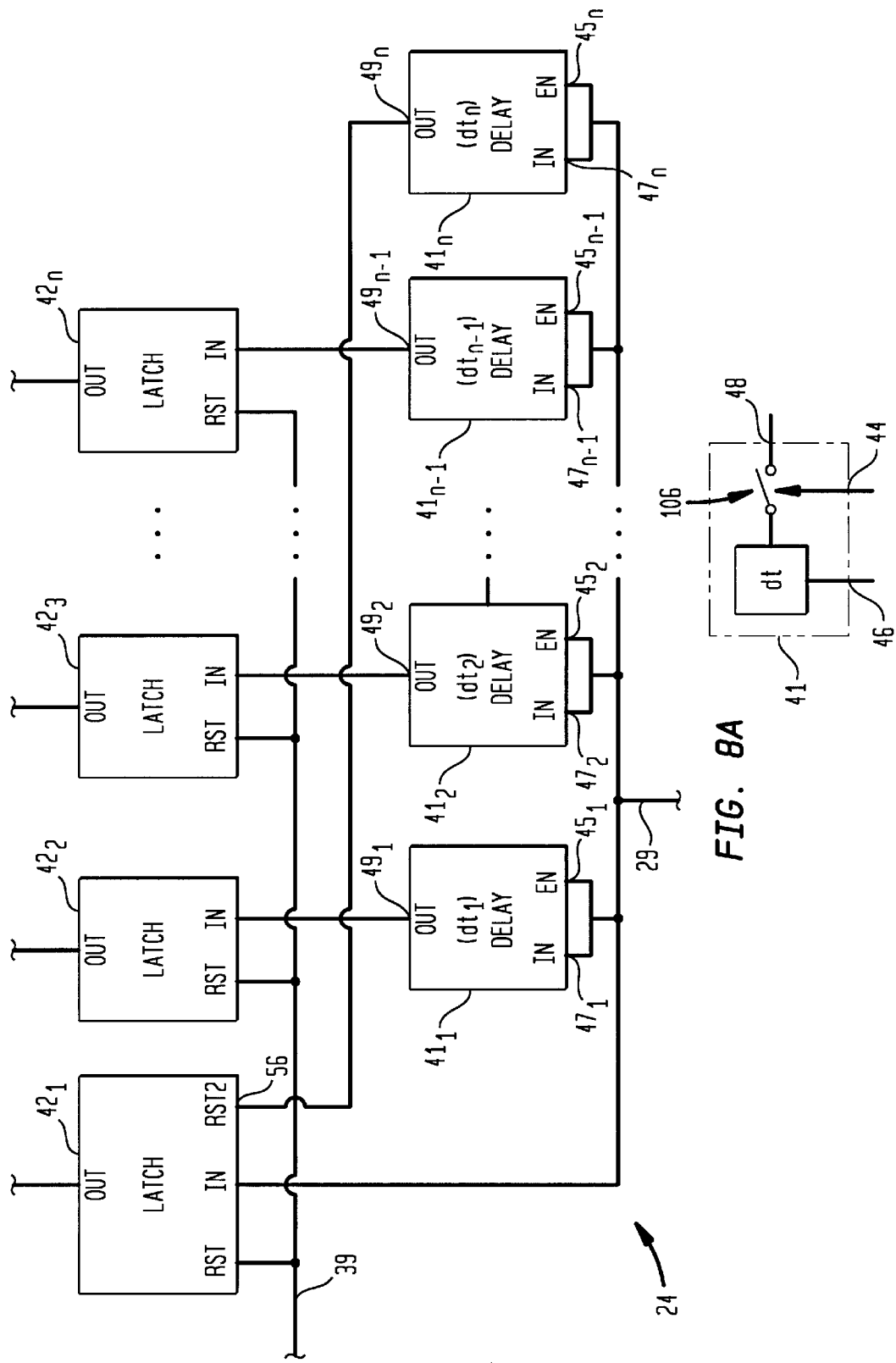

FIG. 8 illustrates another configuration of the test circuitry 24. In this embodiment, delay elements $41_1$–$41_n$ are connected in parallel. The line 29 connects both enable ports $45_1$–$45_n$ and input ports $47_1$–$47_n$ in parallel. Also, feedback from output port $49_n$ of the last delay element $41_n$ to the second reset port 56 of the first latch $42_1$ is provided similar to the configuration shown in FIG. 3. The delay elements $41_1$–$41_n$ have different time delays $dt_1$–$dt_n$. For example, if $dt_1$ is 200 ps, $dt_2$ is 400 ps, etc., then the configuration of FIG. 8 has the same resolution and yields the same output indications (Table 1) as the configuration shown in FIG. 3.

FIG. 8A shows that each of the delay elements 41 functions as a switch 106, that closes in response to a signal (e.g., rising edge of a signal) from the enable port 44, thereby allowing a signal to pass from the input port 46 to the output port 48, delayed by a delay time dt. Each delay element 41 can be implemented as shown in FIG. 5 for the delay element 40.

Figure 9:
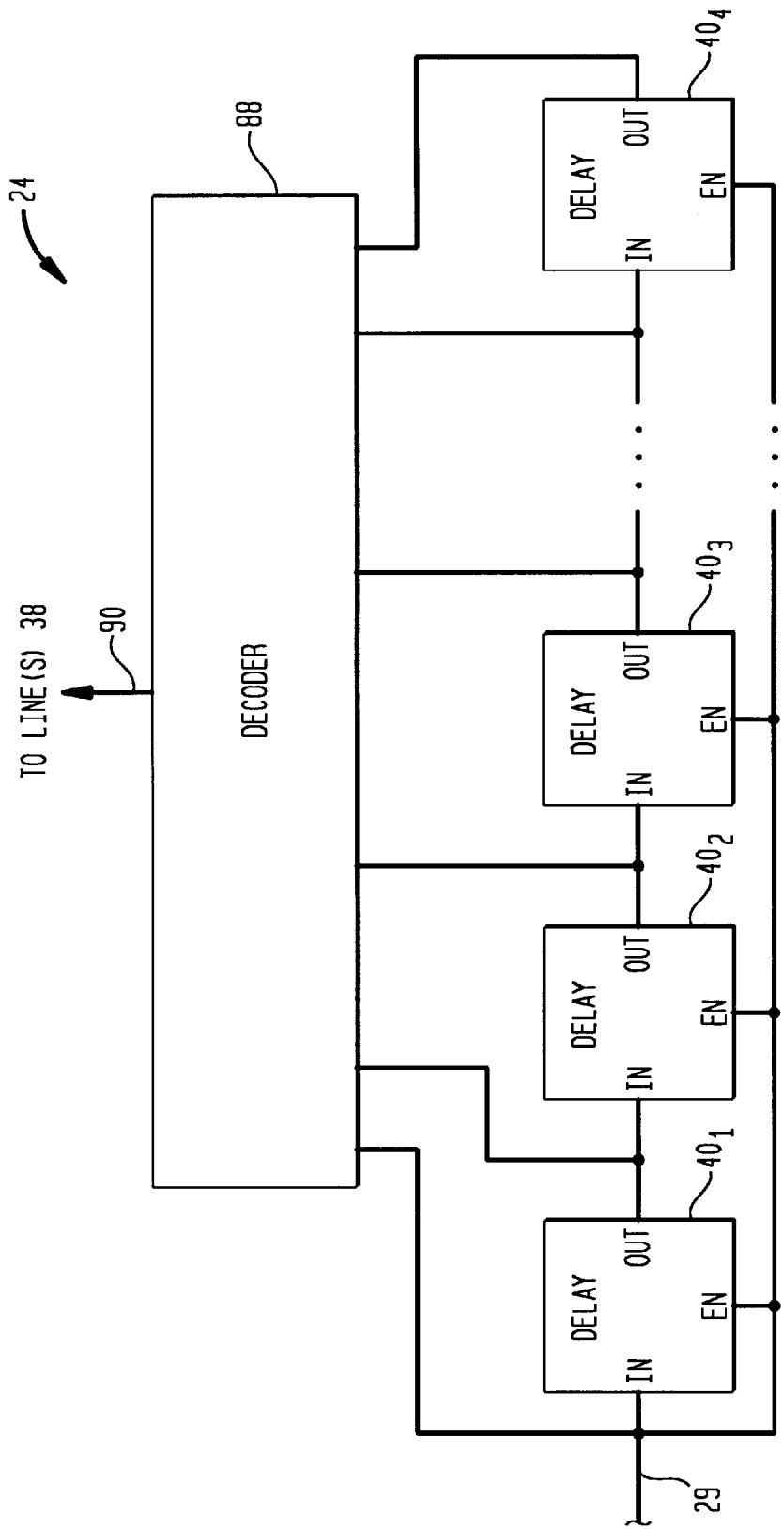
FIG. 9 is a diagrammatical view of another example of the test circuitry shown in FIG. 2.

FIG. 9 illustrates another configuration of the test circuitry 24. As shown, the delay elements $40_1$–$40_n$ are connected to a decoder 88. The decoder 88 outputs one or more indications of the length of a pulse on the line 29 onto one or more lines 90 for coupling to one or more lines 38. The indication on line 90 can be an analog static energy level, e.g., with the magnitude of the level corresponding to the window in which the pulse width falls.

Alternatively, the line 90 can be a bus line carrying n static signals to n lines 38. In this case, the decoder 88 decodes the signals received from the delay elements $40_1$–$40_n$, and outputs only one binary 1 indicative of the window including the pulse width. For example, if there are 5 delay elements 40 each with a delay time of 200 ps, then an output on bus line 90 of 00100 indicates a pulse width of between 400 ps and 600 ps. The "pulse too long" indication uses two 1's, e.g., 00011 for a pulse width longer than 1.0 ns. This arrangement can be accomplished, for example, by using n+1 latches 42 for n delay elements 40, similar to the configuration shown in FIG. 7, but also coupling the output ports $48_1$–$48_{n-1}$ to second reset ports of the latches $42_1$–$42_{n-1}$. Alternatively still, n latches 42 could be used for n delay elements 40, similar to the configurations shown in FIGS. 3 and 8, but coupling the output port $48_n$ to a second input port of the first latch $42_1$ instead of the second reset port 56, and also coupling the output ports $48_1$–$48_{n-1}$ to second reset ports of the latches $42_1$–$42_{n-1}$. In this case, for five delay elements, the "pulse too long" indication is 10001.

Other embodiments are within the scope and spirit of the appended claims. For example, the latches 42 can be transparent latches or D-type registers (i.e., comprising a set of D flip-flops). The delay elements 40 could be implemented using an AND gate without an inverter. Or, "negative" pulses (i.e., the pulse has a voltage lower than the voltage present on the line carrying the pulse) can be detected using an OR gate (or a NOR gate with an inverter) in place of NAND gate 66 for the delay elements 40. Also, no latch needs to be connected to the input port $46_1$ of the first delay element $40_1$, e.g., if pulses shorter than the first time delay $dt_1$ need not be detected.

FIG. 10 shows that delay elements 40' other than that shown in FIG. 5 are possible. As shown, the delay elements $40'_1$–$40'_4$ have alternating configurations. The delay elements $40'_1$, $40'_3$, etc. are combinations of NAND gates 92 and inverters 94. Inputs to the NAND gates 92 correspond to the enable ports 44' and the input ports 46' of the respective delay elements 40'. The enable ports 44' of elements $40'_1$, $40'_3$, etc. are connected in parallel to line 100. The outputs of the NAND gates 92 feed output ports $51'_1$, $51'_3$, etc. and the inverters 94. Outputs of the inverters 94 correspond to the output ports $48'_1$, $48'_3$, etc. of the delay elements $40'_1$, $40'_3$, etc. The delay elements $40'_2$ and $40'_4$, etc. are NOR gates 98 each with one input coupled to respective output ports $51'_1$, $51'_3$, etc. of a corresponding "preceding" delay element $40'_1$, $40'_3$, etc. and the other input coupled in parallel to the line 100 through an inverter 102. Outputs of the NOR gates 98 correspond to the outputs $48'_2$, $48'_4$, etc. and the outputs $51'_2$, $51'_4$, etc. of elements $40'_2$, $40'_4$, etc. The outputs $51'_2$, $51'_4$, etc. are coupled to input ports $46'_3$, $46'_5$ (not shown), etc. of corresponding "following" elements $40'_3$, $46_5$ (not shown), etc.

What is claimed is:

1. An apparatus comprising:

a first device activated and deactivated by leading and trailing edges, respectively, of a pulse received by the first device, the first device being configured to provide the pulse to a plurality of output ports at a plurality of different output times defining a plurality of windows of time durations having corresponding timespans, an inverse of a shortest one of the timespans defining a first frequency; and a second device coupled to the plurality of output ports and adapted to provide one or more indications of whether a portion of the pulse was received at each output port, each indication being detectable at a second frequency that is lower than the first frequency.

2. The apparatus recited in claim 1, the first device further comprises a plurality of delay elements, wherein the plurality of delay elements have a corresponding plurality of enable ports coupled in parallel.

3. The apparatus recited in claim 2 wherein the plurality of delay elements are coupled in series to transmit the pulse between them.

4. A semiconductor circuit comprising:

operational circuitry for producing a pulse having a pulse width;

a plurality of delay elements enabled and disabled in parallel by the pulse, the plurality of delay elements being adapted to provide at least portions of the pulse to a plurality of delay element output ports at a plurality of different times; and a decoder coupled to the plurality of delay element output ports and responsive to the pulse at the plurality of delay element output ports to provide a signal indicative of a window of time durations that includes the pulse width.

5. The circuit recited in claim 4 wherein the signal is a DC signal whose magnitude corresponds to the window.

6. The circuit recited in claim 4 wherein the signal is part of a set of DC signals indicative of binary values.

7. A semiconductor circuit comprising:

circuitry for producing a pulse;

a plurality of n delay elements enabled and disabled in parallel by the pulse, each delay element adapted to transmit the pulse from an input to an output, the plurality of n delay elements configured to transmit the pulse to corresponding outputs of the plurality of n delay elements at different times; and n-1 detectors each having a detector input coupled to an input of a corresponding one of the plurality of n delay elements, each detector adapted to set a state of a detector output to a predetermined state from a plurality of states in response to receiving a portion of the pulse.

8. The circuit recited in claim 7 wherein each detector output is selectively coupled to an output pin of the circuit.

9. The circuit recited in claim 7 wherein the plurality of n delay elements are serially coupled to transmit the pulse from the output of one delay element to the input of another delay element.

10. The circuit recited in claim 9 wherein a delay time introduced to the pulse by each of the plurality of n delay elements between the input. and the output of each delay element is substantially the same.

11. A semiconductor circuit comprising:

circuitry for producing a pulse;

a plurality of n delay elements enabled and disabled in parallel by the pulse, each delay element adapted to transmit the pulse from an input to an output, the plurality of n delay elements configured to transmit the pulse to corresponding outputs of the plurality of n delay elements at different times; and n-1 detectors each having a detector input coupled to an input of a corresponding one of the plurality of n delay elements, each detector adapted to set a state of a detector output to a predetermined state from a plurality of states in response to receiving a portion of the pulse;

wherein each detector output is selectively coupled to an output pin of the circuit; and;

wherein the input port of each of the plurality of n delay elements is connected in common.

12. The circuit recited in claim 11 wherein each delay element is adapted to delay the pulse a substantially unique amount of time between its input and its output.

13. The circuit recited in claim 8 wherein the indication is a DC energy level.

14. The circuit recited in claim 8 further comprising another detector having a detector input coupled to the input of a first one of the plurality of n delay elements.

15. A semiconductor circuit comprising:

circuitry for producing a pulse;

a plurality of n delay elements enabled and disabled in parallel by the pulse, each delay element adapted to transmit the pulse from an input to an output, the plurality of n delay elements configured to transmit the pulse to corresponding outputs of the plurality of n delay elements at different times;

n-1 detectors each having a detector input coupled to an input of a corresponding one of the plurality of n delay elements, each detector adapted to set a state of a detector output to a predetermined state from a plurality of states in response to receiving a portion of the pulse;

further comprising another detector having a detector input coupled to the input of a first one of the plurality of n delay elements; and further comprising another detector having a detector input coupled to the output of a last one of the plurality of n delay elements.

16. A semiconductor circuit comprising:

circuitry for producing a pulse;

a plurality of n delay elements serially coupled and adapted to be enabled and disabled in parallel by leading and trailing edges, respectively, of the pulse, each delay element adapted to delay the pulse as it is transmitted between a delay element input and a delay element output of that delay element; and a plurality of n latches each having a latch input coupled to a corresponding delay element input, each latch adapted to set a state of a latch output port to a first predetermined state in response to receiving a portion of the pulse at the latch input, a selected one of the plurality of n latches having a latch reset coupled to the output of a last one of the plurality of n delay elements and being adapted to set the state of that latch to a second predetermined state in response to receiving a portion of the pulse at the latch reset.

17. A semiconductor circuit comprising:

circuitry for producing a pulse;

a plurality of n delay elements serially coupled and adapted to be enabled and disabled in parallel by leading and trailing edges, respectively, of the pulse, each delay element adapted to delay the pulse as it is transmitted between a delay element input and a delay element output of that delay element; and a plurality of n latches each having a latch input coupled to a corresponding delay element input, each latch adapted to set a state of a latch output port to a first predetermined state in response to receiving a portion of the pulse at the latch input, a selected one of the plurality of n latches having a latch reset coupled to the output of a last one of the plurality of n delay elements and being adapted to set the state of that latch to a second predetermined state in response to receiving a portion of the pulse at the latch reset, wherein the selected one of the plurality of n latches is a first one of the plurality of n latches.

18. A semiconductor circuit comprising:

circuitry for providing a signal including a pulse;

a plurality of n delay elements having enable ports coupled in parallel, each one of the plurality of n delay elements adapted to be activated and deactivated by a first edge and a second edge, respectively, of the pulse received at the corresponding enable port, each delay element adapted to transmit the pulse from a delay element input port to a delay element output port delayed by a corresponding time delay; and a plurality of n-1 latches each having a latch input port coupled to a corresponding delay element input port and adapted to provide a DC signal to a latch output port in response to receiving the first edge of the pulse at the latch input port.

19. The circuit recited in claim 18 wherein the plurality of n delay elements are coupled in series.

20. A semiconductor circuit comprising:

operational circuitry for providing a signal including a pulse;

a delay element including a delay element input port and a delay element enable port both selectively coupled to the operational circuitry, the delay element being enabled and disabled by the pulse incident at the enable port, the delay element configured to receive the pulse at the delay element input port at a first time and provide the pulse to a delay element output port at a second time, later than the first time; and a latching element including a latching element input port coupled to the delay element output port, the latching element output port being selectively coupled to an output contact of the semiconductor circuit, the latching element being configured to provide a DC signal to the output port of the latching element in response to receiving at least a portion of the pulse at an input port of the latching element.

21. The circuit recited in claim 20 further comprising a second latching element having an input port coupled to the delay element input port.

22. An apparatus comprising:

a plurality of n delay elements serially coupled and adapted to be activated and deactivated in parallel by leading and trailing edges, respectively, of a pulse present in a signal received by the delay elements, each delay element adapted to receive the signal at a delay element input port thereof and to output the signal to a delay element output port thereof delayed by a time delay; and a plurality of n detectors each having a detector input port coupled to a corresponding delay element input port and adapted to set a state of a detector output port to a first predetermined DC level in response to receiving the leading edge of the pulse at the detector input port, a first one of the plurality of n detectors having a detector reset coupled to the output of a last one of the plurality of n delay elements and being adapted to set the state of its detector output to a second predetermined DC level in response to receiving the leading edge of the pulse at the detector reset.

23. A system for testing a semiconductor circuit, the system comprising:

a semiconductor circuit comprising:

circuitry for producing a pulse;

a plurality of n delay elements enabled and disabled in parallel by the pulse and adapted to deliver the pulse to corresponding outputs of the plurality of n delay elements at different output times defining time duration windows having corresponding timespans; and a plurality of n-1 detectors each having a detector input coupled to an input of a corresponding one of the plurality of n delay elements, each detector adapted to set a state of a detector output to a predetermined state from a plurality of states in response to receiving a portion of the pulse; and a tester having an operational frequency that is lower than a shortest one of the timespans and being adapted to detect the predetermined state.

* * * * *